United States Patent [19]

Morrissey et al.

[11] Patent Number: 4,683,036
[45] Date of Patent: Jul. 28, 1987

[54] METHOD FOR ELECTROPLATING NON-METALLIC SURFACES

[75] Inventors: Denis M. Morrissey, Glen Cove; Peter E. Takach, Garden City South; Rudolph J. Zeblisky, Hauppauge, all of N.Y.

[73] Assignee: Kollmorgen Technologies Corporation, Dallas, Tex.

[21] Appl. No.: 800,360

[22] Filed: Nov. 21, 1985

Related U.S. Application Data

[63] Continuation-in-part of Ser. No. 501,167, Jun. 10, 1983, abandoned, which is a continuation-in-part of Ser. No. 394,442, Jul. 1, 1982, abandoned.

[51] Int. Cl.⁴ .................................................. C25D 5/54
[52] U.S. Cl. ........................................ 204/15; 29/852; 156/656; 156/659.1; 204/20; 204/30; 204/38.4
[58] Field of Search .................... 204/15, 20, 30, 38.4; 427/96, 97, 98, 304, 305, 306; 106/1.11, 1.13, 1.21; 29/852; 156/656, 659.1

[56] References Cited

U.S. PATENT DOCUMENTS

| | | | |
|---|---|---|---|
| 3,099,608 | 7/1963 | Radovsky | 204/15 |
| 3,443,988 | 5/1969 | McCormack et al. | 117/212 |
| 3,682,786 | 8/1972 | Brown et al. | 204/30 |
| 3,748,109 | 7/1973 | Lee | 204/30 X |
| 3,853,590 | 12/1974 | Kadison et al. | 117/47 A |
| 3,925,578 | 12/1975 | Polichette et al. | 427/304 |
| 3,956,079 | 5/1976 | Kardos et al. | 204/52 R |
| 3,956,084 | 5/1976 | Kardos et al. | 204/52 R |
| 3,962,494 | 6/1976 | Nuzzi | 427/304 |
| 3,984,290 | 10/1976 | Kitaev et al. | 204/30 |
| 3,993,802 | 11/1976 | Polichette et al. | 427/98 |
| 4,036,710 | 7/1977 | Kardos et al. | 204/52 R |
| 4,100,037 | 7/1978 | Baron et al. | 204/15 |
| 4,217,182 | 8/1980 | Cross | 204/15 |
| 4,339,303 | 7/1982 | Frisch et al. | 156/629 |

OTHER PUBLICATIONS

A. Kenneth Graham, Electroplating Engineering, Handbook, Reinhold Publishing Corp., New York, 1955, pp. 205–211.
Metal Finishing Guidebook and Directory for 1978, Metals and Plastics Publications, Inc., Hackensack, N.J., pp. 216–219.
F. A. Lowenheim, Electroplating, McGraw-Hill Book Co., New York, 1978, pp. 194–205.
"Modern Electrochemistry" by J. O'M. Bockris & A. K. N. Reddy, Plenum Publ. Corp., N.Y., N.Y., 1970.

Primary Examiner—John F. Niebling
Assistant Examiner—William T. Leader
Attorney, Agent, or Firm—Morgan & Finnegan

[57] ABSTRACT

Method for electroplating non-metallic surfaces on a substrate, e.g. of plating holes in metal clad laminates, is disclosed. Metallic sites are formed on the surface and the resulting site-containing surface is electroplated by means of an electroplating bath comprising a component which causes the plating to preferentially occur at said sites in comparison to the plating on surfaces of the same metal as the one plated out; whereby a rate differential of the plating-reaction on site-surfaces is achieved with respect to the plating-reaction on a surface consisting of the metal to be plated out.

37 Claims, 8 Drawing Figures

*1 MINUTE*

FIG.3a

*2 MINUTES*

FIG.3b

*3 MINUTES*

FIG.3c

4 MINUTES

FIG.3d

5 MINUTES

20 MINUTES

METHOD FOR ELECTROPLATING NON-METALLIC SURFACES

CROSS-REFERENCE TO RELATED APPLICATIONS

This application is a continuation of U.S. application, Ser. No. 501,157, filed June 10, 1983, now abandoned, which is a continuation-in-part of U.S. application, Ser. No. 394,442 filed July 1, 1982, now abandoned.

FIELD OF INVENTION

This invention relates to metallizing non-conductors. It also relates to manufacture of printed wiring boards with plated-through-holes. In particular it concerns methods of electroplating insulating surfaces and the composition of electroplating solutions used for this purpose.

BACKGROUND OF THE INVENTION

Non-metallic surfaces are usually metallized by first making the respective surface catalytically receptive to electroless metal deposition and subsequently exposing the thus catalyzed surface to a plating bath solution of the kind operating without an external source of electricity and for a time sufficient for forming a metal, e.g., Cu or Ni layer of desired thickness. This initial layer is usually provided with additional metal deposits formed by conventional electroplating. In well known methods for making plated through hole printed circuit boards, this metallizing concept and its variations are employed for metallizing the hole walls. In the version starting with two-sided copper clad laminate as the base material, a panel of suitable size is first provided with the required holes, and rendered catalytically receptive by immersion in a known catalyst solution. Subsequently a metal-, usually copper, deposit is formed by exposure to a bath solution which produces metal deposits without an external source of electricity, generally known as electroless plating baths, and for a time sufficient for achieving a thickness of, e.g., 0.5 to 2.5 microns. This initial, conductive metal-layer is further plated up by means of conventional electroplating.

The typical catalyst solutions employed in the afore-described methods have been used in this industry for many years and have been developed to a relatively high degree of stability. Surfaces treated with such solutions catalytically promote the generation of electroless metal deposits by the oxydation of suitable components present in the electroless plating bath with this mechanism acting as an internal source of electrons to be used in the plating reactor by reducing complexed metal ions to metal.

Operation of electroless plating solutions require rather careful monitoring of the different components and replenishing of used up materials by controlled addition of chemicals. Furthermore, the said plating solutions have a tendency to indiscriminate deposition thus forming metal, e.g., copper deposits on walls and the bottom of tanks used for operating such plating baths. This necessitates frequent interruption of the plating operation, removal of the plating solution from the tank and cleaning the tank walls and bottom by means of an etching operation.

Electroless metal plating is, therefore, rather expensive and complex and needs highly trained operators.

In spite of these substantial shortcomings, electroless deposition of an initial layer of metal has, up to now, been an integral part of all processes used for metallizing non-metallic surfaces including such processes employed in the manufacture of printed circuit boards.

Radovsky et al, U.S. Pat. No. 3,099,608, has described the use of palladium-tin-chloride colloid to form an essentially non-conductive film of colloidal or semi-colloidal particles on the hole walls made in a laminate used to make printed circuits; and of electroplating for copperizing said hole walls.

The process of Radovsky et al has, however, severe shortcomings and was found to be not applicable for practical use. The palladium-tin-chloride colloidal suspension has an unacceptably short life span. It can only be used for about nine days due to coagulation of the suspension and, because of its high palladium content is rather expensive. Furthermore, the Radovsky et al method deposits substantially more copper on the surface than on the walls of through holes and is, therefore, unacceptable for commercial use.

Radovsky et al is based on the use of a "thin, barely visible film of particles" of "semi-colloidal palladium" deposited on the surface to be plated, said film having "substantial resistance" and on the teaching "that the palladium being by nature both a catalytic metal and a conductive metal has potentialities for simultaneous and combined activating and conductive functions" (column 4, lines 53 to 56) and further, that "After the electroplating is started at a conductor it is activated apparently by the catalytic properties of the palladium and the electrodeposition process proceeds directly on the film of conductivator particles" (column 4, lines 62 to 66). At column 5, lines 2 to 7 Radovsky et al state: "Since the colloidal palladium deposit in the through holes was an extremely poor conductor to serve as a base for the electroplating as compared with the deposited graphite something else must have aided in the electrodeposition, i.e., a catalyst must have aided in the plating reaction". In spite of the fact that Radovsky et al's observation dates from 1959 and consequently is contemporary with the use of graphite for metallizing non-conductors and with the first application of the "seeder-electroless plating-technology" for metallizing plastic parts and making plated-through-hole (PTH) boards, it did not result in a process of any practical use. Considering the substantial initial difficulties with the seeder-electroless technology and its development, and further, the continuing complexity characteristic of electroless plating bath operation, control and maintenance, when compared to the comparatively simple electroplating process, it is rather most surprising that Radovsky's observations were of no impact as far as the technological development of the last two decades is concerned. The reason is, that Radovsky's observations did not result in a teaching which allows the average person skilled in the art to make use of it. Lacking this teaching, Radovsky's observation could only be duplicated when using his "conductivator-solution" and the copper pyrophosphate electroplating bath existing at the time. It is believed that Radovsky did not recognize the importance of the composition of the copper electroplating bath. For example, of the known formulations for pyrophosphate electroplating bath employed at the time of Radovsky's filing, the simplest one did not produce copper of adequate quality for printed circuit boards; the more complex type of bath did produce adequate copper quality, but inhibits the working of Radovsky's suggested process. The industry, therefore, found Radovsky's observations to be of no practical use. The "seeding-electroless copper, followed or not followed by the electroplating was consequently accepted as the only approach metallizing non-metallic surfaces available to the art.

Radovsky therefore teaches away from the present invention claimed by applicant. To arrive at this invention the misconception presented by Radovsky that the characteristics of the electroplating baths were not critical had to be overcome and completely discarded.

SUMMARY OF THE INVENTION

In accordance with this invention, there is disclosed a method for metallizing by electroplating directly on non-metallic surfaces of a substrate which comprises the steps of:

(a) forming a plurality of metallic sites on said surface, said sites comprising or consisting of a metal (A), said metal being different from a metal (B) to be deposited on said surface by electroplating;

(b) providing said surface with a connector area said connector area (connector electode) being located outside of the non-metallic surface area to be electroplated;

(c) exposing said surface including at least a portion of said connector area to an electroplating bath solution having a defined conductivity and comprising said metal (B) to be electroplated in ionic form; and one or more components (C) which cause preferential deposition of said metal (B) on said metallic sites comprising or consisting of metal (A), compared to the deposition on surfaces consisting of, or formed by the species of the elctrodeposited metal (B);

(d) providing the vessel containing the said electoplating bath solution with a counter-electrode;

(e) applying a potential to the connector area and the counter-electrode sufficient to initiate and cause the preferential deposition of metal (B) on said sites comprising or consisting of metal (A), for a time sufficient to form a deposit of substantially uniform desired thickness.

In one embodiment, the rate of deposition on the metallic sites is at least one order of magnitude greater and preferably two orders greater than the rate of deposition on the plated-out metal.

In another embodiment, the metallic sites and the metal to be deposited are comprised of metals selected from Groups Ib or VIII of the Periodic Table of Elements provided that they are not the same.

In still another embodiment, the component referred to above is selected from dyes, surfactants, chelating agents, brighteners or leveling agents.

In yet another embodiment, the substrate provided with metallic sites is exposed to one or more of the following treatments: heat treatment; treatment with a cleaner conditioner; and/or treatment with a reducing agent.

DETAILED DESCRIPTION OF THE INVENTION

The method disclosed and claimed herein is an improved, method of plating non-metallic surfaces on a substrate. More particularly, it is a highly effective method for plating through hole walls in metal clad laminates.

A special advantage obtained in the manufacture of plated-through-hole printed circuits is the integrity of the copper hole wall. Since the copper is electroplated directly on the non-metallic hole wall substrate without an intervening electroless metal layer the physical properties and adhesion at the copper-plastic interface are greatly improved. This is particularly important in the manufacture of high reliability printed circuits such as multilayers.

In practice, the method of this invention for electroplating non-metallic surfaces on a substrate involves the steps of forming discrete metallic sites on the surface to be plated in which said metallic sites are of a metal species different from the species of the metal to be deposited, providing a connector area on said substrate and outside the non-metallic surface area to be electroplated, contacting said surface to be plated and at least part of the connector area with an electroplating bath which contains a plateable metal of the species to be electrodeposited and a component which allows preferential deposition of said metal to be deposited on said metallic sites over plated-out metal from said electrodepositing metal, providing a vessel containing the electroplating bath with a counter-electrode, and applying a potential between the electrodes formed by said connector area and said counter electrode sufficient to initiate and cause preferential deposition on the surface provided with said sites for a time sufficient to form a deposit of desired, substantially uniform thickness.

Without intending to be bound by any particular theory, it is applicant's belief that the direct electroplating process claimed herein is based on the following principles.

I. (1). Metallic sites are provided on the non-metallic surfaces are connected to a "connector area" (connector-electrode) also provided on said surface by the plating bath electrolyte forming a "resistive path" between the connector area and the neighboring sites. Similar paths are formed between sites.

(2) The higher the conductivity of the electrolyte the lower the resistance of the "resistive path;" with a theoretical electrolyte of infinite conductivity, all sites would be at the same potential as that of the connector area. Conversely, with a theoretical electrolyte of very low conductivity, the resistance between sites and the connector area would for all practical purposes be too high for developing a potential for plating on the sites.

(3) With practical electrolytes, a voltage drop develops on the resistive path. Thus, based on the foregoing:

(a) The potential supplied by the power source to the counter-electrode and the connection area has to be selected so as to compensate not only for the voltage drop between the electrodes including deposition overvoltage but also for the voltage drop on the resistive path formed by the electrolyte so that the adequate plating potential is supplied to the metallic sites:

(b) the higher the electrolyte conductivity, the faster is the plating reaction on the sites (and also the more uniform in thickness):

(c) the conductivity of the electrolyte should be selected as high as acceptable with respect to plating parameters.

The term conductivity as used herein is defined as a function of the concentration of the current carrying species, i.e., in an acidic bath, the hydrogen ions are assumed to act as the main current carrying species.

II. (1) For all practical purposes it is imperative that the deposit formed by electroplating is substantially uniform and that its thickness is substantially not a function of the distance to the connector area. In the case of printed circuit boards with holes with metallized hole walls, the deposit on the surface and the one on the hole walls should not be of substantial, inadmissible difference in thickness.

(2) The problem of non-uniformity also exists for electroplating in general. To overcome it, certain additives are used in the plating bath known e.g., as leveling agents.

(3) Pyrophosphate electroplating baths comprising such additives product satisfactory results if used in the standard "seeding, electroless-electroplating" process.

(4) Copper pyrophosphate baths of the additive comprising type, available at the time, rendered the process suggested by Radovsky inoperative. The reason for this is that the additives commonly used attach themselves equally on the metal of the species plated out (copper) and the palladium of the metallic sites or, even preferentially attach themselves to the latter thus interferring with or inhibiting the plating operation on said sites. Rather unexpectedly, in the light of Radovsky, applicant obtained satisfactory results as far as both uniform thickness and superior quality of the deposit is concerned, by employing bath formulations comprising one or more components which preferentially attach themselves to the species of the metal to be plated out thus reducing the plating action on said surfaces if compared to the plating action on the metallic sites of a different, suitable metal, e.g., palladium, or by preferentially attaching themselves to the metal of the metallic sites and increasing the plating action on said sites if compared to the surface of the species of the metal plated out.

The problems described above with respect to the use of the seeding, electroless-electroplating process as well as the inoperative procedure described in Radovsky's U.S. Pat. No. 3,099,608 are completely overcome by the invention claimed by applicant and disclosed herein.

As is evident from the above theorized mechanism, the potential applied must be sufficient to electrodeposit said plateable metal at a rate faster on said discrete sites than on the plated-out metal. In practice, this potential is determined by well-known, and accepted electrochemical techniques.

One such technique involves measurements of the current-potential relationships for the electrodepositon of a metal on various substrates in the absence and presence of the component (C). In the potential range applicable in standard electrodeposition solutions (e.g., for a copper sulfate and sulfuric acid plating solution approximately 0 to $-200$ mV vs saturated calomel electrode, and for a copper pyrophosphate plating solution approximately $-300$ to $-1,000$ mV vs saturated calomel electrode), it is found that the rate of plating on various substrates (e.g., those comprising the metallic sites) is faster when the plating solution contains component (C) compared to the rate of plating on other substrates, e.g., the metal which is to be plated out.

Adsorptive components (component (C)) of the electroplating solution can be selected on the basis of the current-potential curves obtained with an electrode made of the electroplating metal (e.g., copper) and with the electrode made of metal employed for forming the metallic sites (e.g., palladium). Current-potential curves are recorded using the three-electrode system comprising the test, the counter, and the reference electrodes. Electrode polarization can be performed either by applying the linearly changing potential and recording the current (voltametric method), or by applying a constant current and recording the potential (galvanostatic method). Description of the three-electrode system, voltametric, and galvanostatic methods are given in the book entitled "Modern Electrochemistry", by J. O'M. Bockris and A. K. N. Reddy, published by Plenum Publ. Corp., New York, N.Y., 1970, pages 891–893, 1019–1026.

Figure 1:
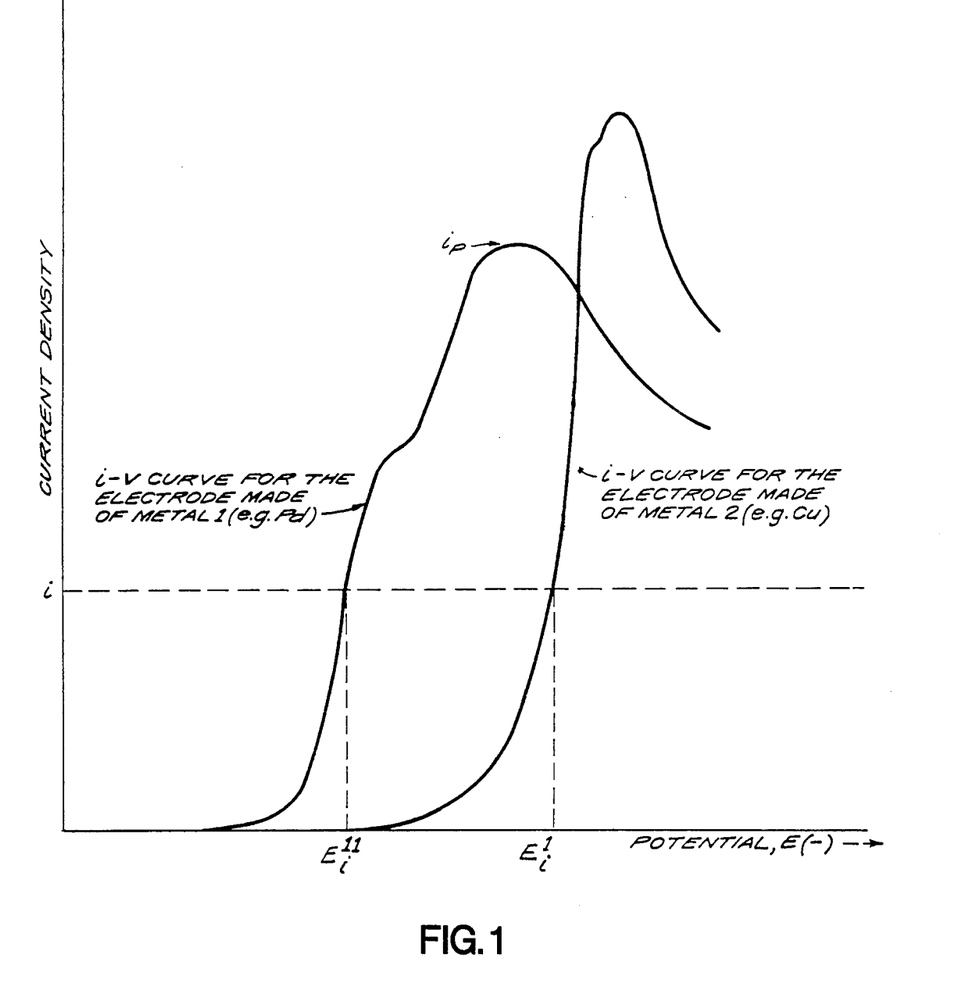
FIG. 1 is a graphical presentation showing the current-potential relationship defining the difference delta $(E)_i = E'_i - E''_i$.

A rapid method for selecting the bath composition for the process of this invention uses current-potential curves to evaluate the difference, delta $(E)_i$, which is defined by:

$$\text{delta }(E)_i = E'_i - E''_{HD\, i}$$

where $E'_i$ and $E''_i$ are potentials, at the current density i, of the electrode made of the electroplating metal and the metal employed for forming the metallic sites, respectively (FIG. 1). The current density i is in the range of 30–50% of the peak current $i_p$ (FIG. 1). With the current density selected in this way the electrode made of the metal employed for forming the metallic sites is not substantially covered by the plating metal at the $E_i$ potential. The current density i in the galvanostatic method is selected also in a way such that there is nonsubstantial coverage of the electrode made of the metal employed for forming the metallic sites with the plated metal.

The procedure for selection of the adsorptive components consists of the following steps:

(1) Record current-potential (i-v) curves for the two types of test electrodes, the electroplating metal (e.g., Cu) and the metal employed for forming metallic sites (e.g. Pd);

(2) Select current density i in the range of 30–50% of the peak current (3) Read potentials $E'_i$ and $E''_i$ for the selected current from the current-potential curves (i-v);

(4) Calculate the difference in potentials:

$$\text{delta}(E)_i = E'_i - E''_i$$

(5) Adsorptive component causing the highest delta$(E)_i$ value is the preferred component, i.e., the bath with the highest value of the difference delta$(E)_i$ is the preferred bath.

The same method and criterion is used to select the preferred concentration of the adsorptive component.

Figure 2:
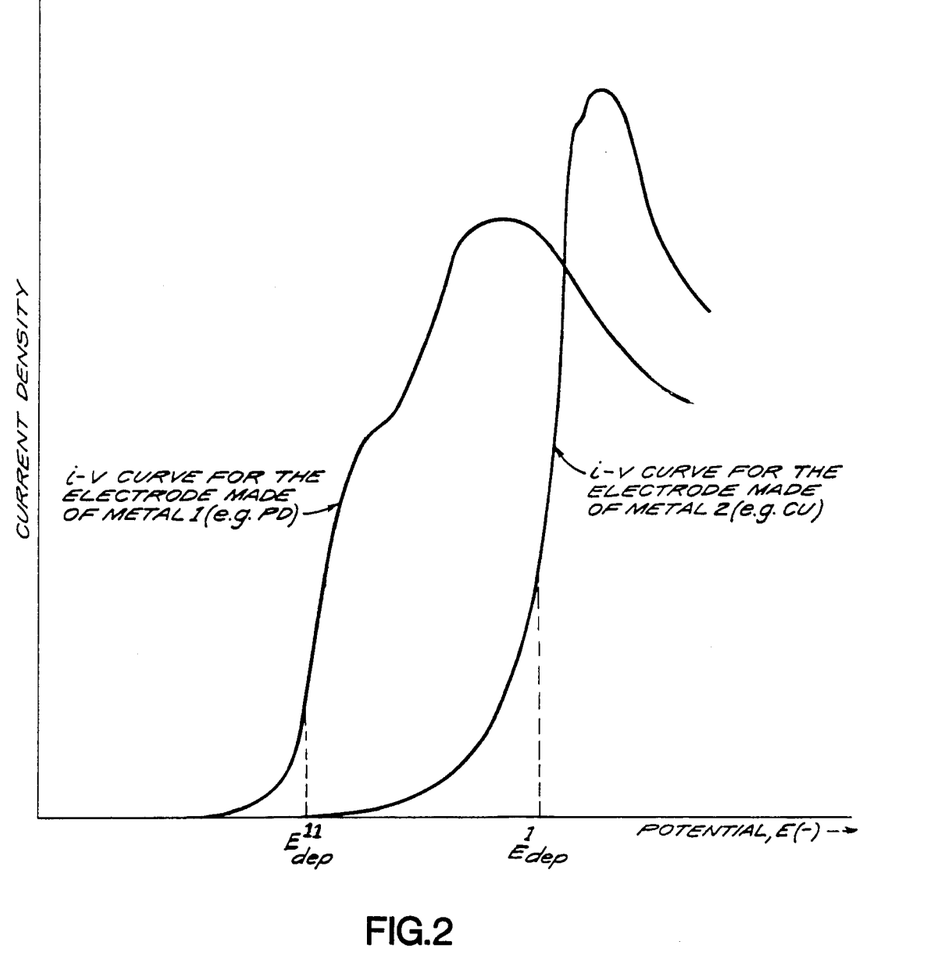
FIG. 2 is a graphical presentation showing the current-potential relationship defining the difference delta$(E)_{dep} = E'_{dep} - E''_{dep}$.

Another rapid method for selecting the bath composition for the process of this invention also uses current-potential curves, but in this case the function delta$(E)_{dep}$ is determined, and this is defined by $$\text{delta}(E)_{dep} = E'_{dep} - E''_{dep}$$

where $E'_{dep}$ and $E''_{dep}$ respectively, are the deposition potentials (i.e., the potentials extrapolated to zero current from the current/potential curves) for the plateable metal on the substrate made of the electroplating metal and for the metal employed for forming the metallic sites (FIG. 2).

The experimental method is the same for this technique as for the previously described method. However, $E'_{dep}$ and $E''_{dep}$ are calculated by extrapolating the current/potential curves to zero current and then reading the values of $E'_{dep}$ and $E''_{dep}$. In this procedure for selection of bath composition for the process of this invention, the bath with the highest delta $E_{dep}$ value is the preferred bath. Adsorptive component causing the highest delta $E_{dep}$ value is the preferred concentration of the adsorptive component.

Both of these quick methods for selecting bath composition for plating at the constant current can be modified for the use in other techniques of metal plating, such a pulse plating, fast galvanostatic or potentiostatic plating. Besides the above described quick methods for selecting bath composition for the process of this invention other methods (Ref. given above, J. O'M. Bockris and A. K. N. Reddy, pp. 1017 and seq.) used in the electrochemical scientific studies, can be used in the same way.

Accordingly, any component which causes the plating rate to be faster on the metallic sites than on the plateable metal as described above is within the purview of this invention.

In one embodiment of the present invention, the component (C) effects preferential deposition by preferentially attaching itself to a surface of the species of metal (B) if compared to the surface of the species of metal (A) thus substantially inhibiting or reducing the plating reaction on surfaces formed by metal (B) without substantially interfering with the plating reaction on surfaces formed by the species of the site metal (A). In another embodiment, component (C) preferentially attaches itself to the species of the site metal (A) with said attached component (C) reducing the overpotential and thus increasing the plating reaction if compared to said reaction on surfaces of the species of metal (B).

In accordance with a preferred embodiment of the invention, the conductivity of the electroplating bath solution and the potential applied to the connector area and the counter electrode are selected sufficiently high to achieve a rate of deposition on the surface of the species of the site metal (A) which is at least one order, and preferably two orders of magnitude higher than the deposition rate on the surface of the species of metal (B). It was found that the maximum conductivity suitable for the process of this invention is for all practical purposes as high as permissible with respect to other plating parameters.

It was also found that the potential applied to the electrodes has to be selected to compensate for the potential drop on the resistive path formed by the plating bath solution between the connector area and the metallic sites consisting of, or comprising metal (A), and between such neighboring sites.

Moreover, it is preferred that this potential be selected at the highest value permissible with respect to the other plating parameters.

The metal (A) as well as metal (B) may be selected from Groups Ib or VIII of the Periodic Table of Elements provided that they are different.

Preferably metal (A) and (B) are selected in such a way that metal (A) displays a lower plating potential than metal (B) under the conditions provided by the plating operation.

Preferred metals for (A) are selected from palladium platinum, silver and gold with the most preferred being palladium.

Preferred metals (B) are selected from copper and nickel.

The preferred electroplating bath solutions are acidic.

Component (C) may be selected from dyes, surfactants, chelating agents, brighteners and leveling agents which preferentially attach themselves to surfaces comprising or consisting of metal (B) and acting by reducing or inhibiting the plating reaction and/or form depolarizing agents preferentially attaching themselves to surfaces consisting of metal (A) and increasing the plating reaction on said surface.

Suitable dyes are, e.g., the ones selected from Victoria Pure Blue F80, methylene blue, methyl violet, acid blue 161, Alcian blue 8GX, and other N-heterocyclic compounds, triphenylmethane type dyes and aromatic amines, imines and diazo compounds including fused ring amines, imines and diazo compounds. Suitable surfactants include nonionic surfactants such as alkylphenoxy polyethoxyethanols, e.g., octylphenoxy polyethoxyethanol, and nonionic fluorocarbon surfactants such as Zonyl FSN, a commercial product of E. I. DuPont deNemours and Co. (Inc.).

Among the many surfactants, including wetting agents and water soluble organic compounds proposed for use in electroplating solutions are surfactants and polymers containing polyoxyethylene. Compounds containing as low as four and as high as one million polyoxyethylene groups have been found to be effective. A preferred group of said compounds includes polyoxyethylene polymers having as few as twenty and as many as 150 polyoxyethylene groups. Also preferred are block copolymers of polyoxyethylene and polyoxypropylene. Among these preferred block copolymers are those containing from seven to two hundred fifty oxyethylene groups. In general it has been found that these polyoxyethylene compounds when added to an electroplating bath, particularly an acidic electroplating bath, will greatly enhance the growth of electroplated metal on the non-conductor surfaces provided with said metallic sites. Most frequently these polyoxyethylene compounds are used in he electroplating solutions in a concentration range of 0.1 to 1 g/l. The optimum concentration depends on the composition of the electroplating solution and polyoxyethylene compound selected. In some cases less than 0.1 g or more than 1 g/l and up to 100 g/l may be preferred.

Representative chelating agents include riboflavin, 2,4,6-(2-pyridyl)-s-triazine and the pyrophosphate anion.

Suitable brighteners and leveling agents include N-heterocyclic compounds, triphenylmethane type dyes, thiourea and thiourea derivatives. Among the thiourea derivatives which are suitable for use are tetramethylthiuram disulfide and allyl thiourea. Suitable commercial examples are Electro-Brite PC-667 (a commercial product of Electrochemicals, a Division of Dart Industries, Inc.) and Copper Gleam PC (a commercial product of LeaRonal Co.). Other suitable additives include saccharin, and o-benzaldehyde sulfonic derivatives which are especially useful in Watts nickel plating bath.

In the preferred embodiments of the invention, metallic sites are formed by treating the respective surface with a solution comprising the metal (A) as a compound or complex, e.g., as metal-halide chloride as exemplified by palladium-tin chloride, a double metal halide. Reference to such double metal halides can be found in U.S. Pat. Nos. 3,011,920, 3,532,518, 3,672,923 and 3,672,938, incorporated by reference herein.

In forming metallic sites of metal (A) it has been found advantageous, following treatment with the said solution, to expose the surface to a reducing agent.

In the case of the site-forming compound comprising tin, it has further been found advantageous to remove the tin-compound from the surface provided with sites. This is accomplished by a tin removing solvent such as a dilute aqueous fluoroboric acid solution or strongly basic solutions which allow formation of soluble alkali stannites.

In order to achieve improved shelf-life of the surfaces provided with sites it has been found advantageous to expose the surface treated with the site providing solution to a heat process, e.g., at a temperature of 65°–120° C. for 10 minutes or longer. It has been found that surfaces thus treated immediately after removal from the site providing solution may be stored for extended periods of, e.g., 9 months without detrimental influence. It is advantageous after extended storage to expose the sites to an acidic solution e.g., one molar sulfuric acid for 15 to 20 minutes.

Suitable reducing agents mentioned above may be selected from sodium borohydride, formaldehyde, dimethylamine borane or hydroxylamine.

It has also been found advantageous to pretreat the non-metallic surface prior to the site-providing step by exposing it to a cleaner conditioner, for example, an aqueous solution containing a blend of nonionic and cationic wetting agents. Such cleaner conditioners are widely used in printed circuit and plating on plastics arts.

DETAILED DESCRIPTION OF THE DRAWING

FIGS. 1 and 2 are explained in detail previously herein.

Figure 3A:
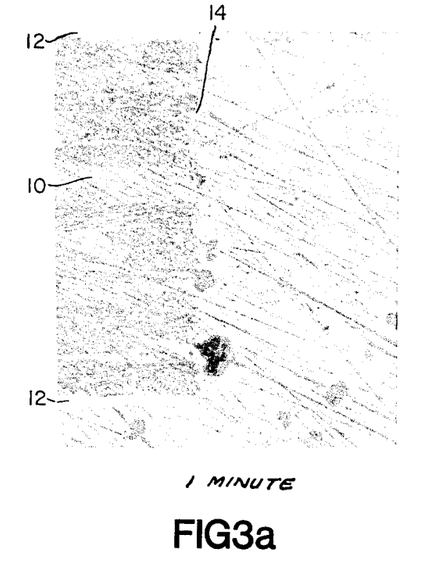
FIG. 3 represents a series of photographs showing a chronological sequence of electrodeposition according to the method of this invention.

FIG. 3a is a photograph of a cross-section of one side of a hole in the sequence (a) to (f) taken after 1 minute of electrodeposition in an electroplating bath. The substrate is a copper clad (12) laminate (10) provided with palladium metallic sites on the walls (14) of the through hole. Copper (16) is the metal being deposited. The copper cladding on the surfaces of the laminate serves as the connector area.

Figure 3B:
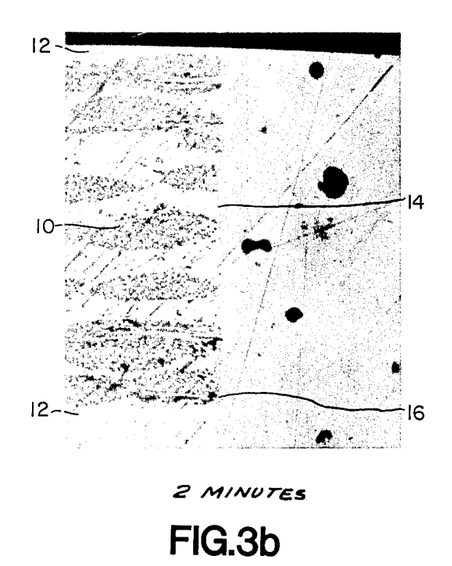

FIG. 3b is a photograph of a cross-section of another hole in the same substrate taken after 2 minues electrodeposition.

Figure 3C:
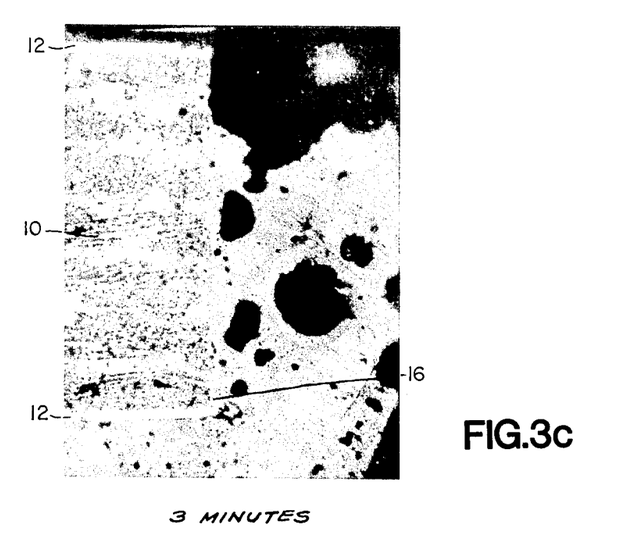

FIG. 3c is a photograph of a cross-section of another hole in the same substrate taken after 3 minutes electrodeposition.

Figure 3D:
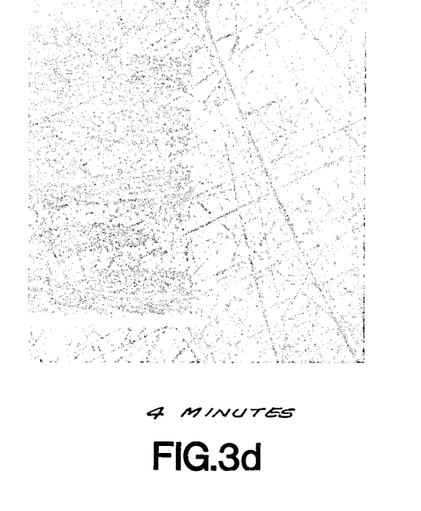

FIG. 3d is a photograph of a cross-section of another hole in the same substrate taken after 4 minutes electrodeposition.

Figure 3E:
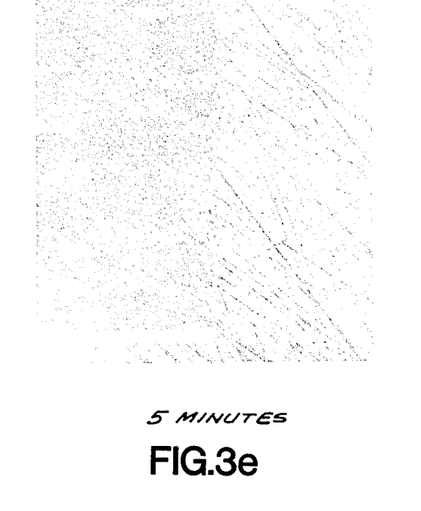

FIG. 3e is a photograph of a cross-section of another hole in the same substrate taken after 5 minutes electrodeposition.

Figure 3F:
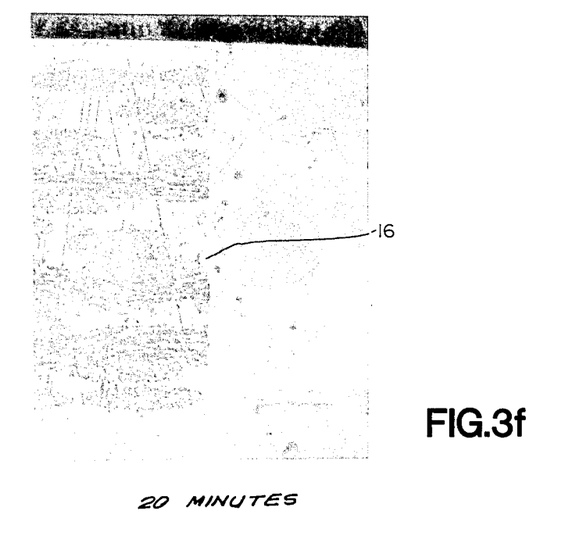

FIG. 3f is a photograph of a cross-section of another hole in the same substrate taken after 20 minutes electrodeposition.

This series of photographs show that the metal deposition on the surface of the hole is uniform and continuous.

EXAMPLE 1

This example describes metallizing the walls of holes drilled in copper clad insulating sheets of the type used in the manufacture of printed circuits. Panels were cut from a 1.6mm thick, copper clad, FR-4 epoxy-glass sheet.

Holes were drilled in the copper clad epoxy-glass FR-4 panels.

The panels provided with holes were then treated with a solution which contains a cationic surfactant, a nonionic surfactant and an alkanolamine, adjusted to a pH below 4; thus cleaning and conditioning the hole wall surfaces for subsequent treatment steps.

Subsquently the panels were dipped into a 1% aqueous sulfuric acid solution for 5 minutes, water rinsed, treated with a sodium persulfate solution (120 g/l at a pH less than 2) for 45 seconds at 40C, to deoxidize the copper surface, and again water rinsed.

The panels were than treated for 5 minutes in a predrip solution containing: stannous chloride, 5 g/l; sodium chloride, 225 g/l; and sufficient hydrochloric acid to obtain a pH of less than 0.5. After the pre-dip step the panel was exposed for five minutes to a palladium-tin-chloride solution at 55C. The panels were continuously agitated in the palladium-tin-chloride solution. The palladium-tin-chloride solution was formulated as follows: the solution of Example 3 of U.S. Pat. No. 3,682,671, incorporated herein by reference, is diluted to a palladium concentration of 210 mg/l by mixing with a solution 3.5M sodium chloride and 0.08M stannous chloride. After immersion in the palladium-tin-chloride solution the panels were water rinsed, heat treated in an oven for 60 minutes at 100C and then brushed.

Some of the panels were electroplated in an electroplating solution consisting of: copper sulfate, 0.3 Mole; sulfuric acid, 1.8 Mole; and hydrogen chloride, 1.3 millimole. The current density was 3.8 A/sq. dm. Before electroplating, the copper surfaces were deoxidized by dipping for five seconds in a solution of sodium persulfate. After electroplating for 5 minutes, only 10% of the hole wall was covered. After electroplating for one hour, the panels were removed and the holes examined. Copper was electroplated partially down the walls of the hole, but there was no plating at the mid-point which left a void in the center of the hole.

Additional panels were electroplated after 5 g/l of a nonionic surfactant, octlylphenoxypolyethoxyethanol, was added to the copper electroplating solution. The hole walls were completely covered with a continuous film of copper metal, without voids, in less than 5 minutes.

EXAMPLE II

Additional panels prepared by the method of Example I were electroplated in a copper electroplating solution which was the same as Example I except that it contained 5 g/l of methyl violet instead of the nonionic surfactant. After five minutes of electroplating, the hole walls were covered with a complete, continuous film of copper metal.

EXAMPLE III

The procedure of Example II was repeated except that methylene blue was substituted for methyl violet. Again, after five minutes of electroplating, the hole walls were covered with a complete, continuous film of copper.

EXAMPLE IV

The procedure of Example I was repeated except that a Watts nickel electroplating bath was substituted for the copper electroplating bath. The Watts nickel bath consisted of: nickel sulfate, 300 g/l; nickel chloride, 30 g/l; and boric acid, 30 g/l. There was only incomplete plating on the hole walls. A saccharin brightener was added to the Watts nickel bath, and another panel was plated. A complete continuous film of electroplated nickel quickly covered the hole walls.

EXAMPLE V

The procedure of Example IV was repeated except the Watts nickel plating bath contained 20 ml/l of Lec-tro-Nic 10-03, a brightener comprising an o-benzaldehyde sulfonic acid (commercially available from Sel-Rex, Hooker Chemicals and Plastics Corp., Nutley, NJ 07110). A complete continuous film of electroplated nickel was obtained on the hole walls.

EXAMPLE VI

The procedure of Example IV was repeated except that Copper Gleam PC, a brightener used for copper sulfte/sulfuric acid electroplating bath, comprising a tiphenylmethane dye was added to Watts nickel bath. A complete continuous film of electroplated nickel was obtained on the hole walls.

EXAMPLE VII

This example describes the manufacture of a printed circuit utilizing the metallizing techniques of this invention.

Copper clad insulating sheet of FR-4 or CEM-3 grades are cut into convenient size panels for the manufacturing process. The holes required for plated through hole connections are drilled, and the copper surfaces of the panel are deburred. The panels are then treated as in Example I in a cleaning and conditioning solution, sulfuric acid solution, rinse, sodium persulfate solution, rinse, pre-dip solution, and a palladium-tin-chloride solution. Subsequently the panels are rinsed, heat treated in an oven for 20 minutes at 120C, and brushed. The panels may be stored at this stage or processed immediately without process interruption.

At this stage the panels are provided with a plating resist mask produced by well-known photoprinting, screen printing or other suitable processes.

The panels are then subjected to a reverse current electrocleaning procedure at 3 A/sq.dm in an alkaline cleaner for 45 seconds, rinsed and sodium persulfate treated (as above) for 5 seconds and rinsed again.

The panels are then electroplated for 5 minutes at 3 A/sq.dm using a bath comprised of the following:
Copper sulfate 75 g/l
Sulfuric acid 190 g/l
Chloride ion 70 ppm
Electro-Brite (PC-667) 5 ml/l The resulting panels are then rinsed and copper electroplated for 40 minutes at 3 A/sq.dm in a bath containing:
Copper sulfate 75 g/l
Sulfuric acid 190 g/l
Chloride Ion 50 ppm
Copper Gleam PC 5 ml/l Alternatively, the panels, instead of undergoing the dual electroplating steps described above, are plated in a single step for approximately 45 minutes at 3 A/sq.dm in the first electroplating bath described above.

The panels are then rinsed, and then converted to printed circuit boards by the well known steps of solder plating at 2 A/sq.dm for 18 minutes, rinsing, resist stripping, etching with ammoniacal copper chloride solution, solder fusing, applying solder mask and trimming the circuit board size.

EXAMPLE VIII

A copper clad panel is processed in accordance with Example VII up to and including the step of exposing the panel to a palladium-tin-chloride solution. This step is followed by a rinse and then immersion in a 5% fluoroboric acid solution which is a solvent for the tin component of the palladium-tin-chloride sites deposited on the walls of the holes. Then the panel is plated at 3 A/sq.dm in a copper electroplating bath formulated in accordance with the present invention and composed as follows:
Copper sulfate 75 g/l
Sulfuric acid 190 g/l
Chloride ion 50 ppm
Copper Gleam PC 5 ml/l After depositing a layer of copper 35 micrometers thick, the panel is rinsed, dried and, by well-known techniques, a positive photoresist etch mask is applied covering the desired circuit pattern including the plated through holes. The copper is etched, and the resist subsequently removed by standard processes, thus forming a finished printed circuit board.

EXAMPLE IX

This example describes the preparation of a printed circuit board of the multilayer type. A well known procedure is used to form a multilayer composite by combining individual layers of circuit patterns on insulating carriers and forming them into a laminate. After the through holes are produced and the smear removed from the copper layers forming part of the hole walls, the laminate is then processed as described in Example VII or VIII.

EXAMPLE X

This example describes the preparation of a printed circuit board on a bare or unclad laminate not provided with copper foil on its surfaces.

The surfaces of the panel are provided with an adhesive layer by the method of Stahl et al, U.S. Pat. No. 3,625,758, and holes are formed. The panel is attached to an electroplating fixture to provide a suitable conductive border forming a suitable connector area. The panel is adhesion promoted by the procedures of Stahl et al. The panel is then processed as described in Example VIII.

EXAMPLE XI

Copper clad, FR-4 epoxy glass panels were drilled to form through holes, cleaned and treated with conditioning solution, pre-dip solution and palladium-tin-chloride solution as in Example I. Following the palladium-tin-chloride solution and rinse, the copper clad panels were dried and immersed one in each of the following reducing agents (dissolved in aqueous 1.5M sodium hydroxide solutions):
Sodium borohydride
Hydroxylamine.

Both panels were electroplated for two minutes in the copper electroplating bath of Example VIII. Complete, continuous films of copper were obtained on the hole walls.

EXAMPLE XII

The procedure of Example XI was repeated except that an aqueous solution of potassium hexachloroplatinate (IV) and stannous chloride, was substituted for the palladium-tin-chloride solution. The reducing agent used was a 1 g/l solution of sodium borohydride. The holes were covered with a continuous film of copper in less than 5 minutes of electroplating.

EXAMPLE XIII

The procedure of Example VIII was repeated except that a copper pyrophosphate electroplating bath was substituted for the copper sulfate/sulfuric acid bath. The copper pyrophosphate bath had the following formulation:

Copper 32 g/l
Pyrophosphate anion 245 g/l
Ammonia 225 g/l
Temperature 52C

The pyrophosphate anion performed the function of component C. After 5 minutes plating at 4.5 A/sq.dm there was complete coverage of the hole wall with copper. When another panel was plated in the same plating bath with the addition of 1 ml/l of the conventional brightner for copper pyrophosphate plating baths, a dimercaptothiadiazole compound (commercially available as PY61H from M&T Chemicals Inc., Rahway, NJ 07065). After 5 minutes in the copper pyrophosphate bath with the conventional PY61H brightner, the hole walls were not plated. the dimercaptothiadiazole is strongly adsorbed on the palladium metallic sites and prevents preferential deposition on the palladium metallic sites.

EXAMPLE XIV

The procedure of Example VII was repeated except that following the palladium-tin-chloride solution and rinse-step the copper clad panels were, without drying, immersed in a solution containing fluoboric acid (100 ml/l) and hydroxyethylene diamine triacetic acid (4 g/l) for 0.5 minutes, rinsed and then electroplated according to this invention in a copper electroplating solution which was the same as Example I except that the nonionic surfactant was Pluronic F-127, a block copolymer of propylene and ethylene oxides (commercially available from BASF-Wyandotte Corp) was present in the solution as Component C in a concentration of 0.2 g/l. After 5 minutes of electroplating at a potential providing a current density of 3.8 A/dm² the hole walls were covered with a complete, continuous film of copper.

EXAMPLE XV

In the following examples the procedure for Example XIV was repeated with A being the same and Examples B to 0 using different surfactants as component C, and with concentrations, current densities and plating times as shown hereinafter. The result after electroplating, in all cases, was a complete void free continuous film of copper covering the hole walls.

| Example | Compound | Conc (g/l) | CD (A/dm) | Plating Time (Min) |
|---|---|---|---|---|
| A | Pluronic F-127 | 0.2 | 3.8 | 5 |
| B | Pluronic F-127 | 0.2 | 5.92 | 3 |
| C | Carbowax 1540 | 0.3 | 3.8 | 5 |
| D | Carbowax 1540 | 0.3 | 5.92 | 3 |
| E | Pluronic F-68 | 1.0 | 3.8 | 5 |
| F | Pluronic F-68 | 1.0 | 5.92 | 3 |
| G | Pluronic L-42 | 1.0 | 3.8 | 5 |
| H | Polyox WSR 80 | 1.0 | 3.8 | 15 |
| I | Carbowax 4000 | 0.5 | 3.8 | 15 |
| J | Olin 10 G | 0.5 | 3.8 | 15 |
| K | Olin 6 G | 0.5 | 3.8 | 15 |
| L | Carbowax 20 M | 0.5 | 3.8 | 15 |
| M | Pluronic L-64 | 0.5 | 3.8 | 15 |
| N | Tergitol Min Foam 1 X | 0.5 | 3.8 | 15 |
| O | Carbowax 600 | 1.0 | 3.8 | 15 |

Pluronic is BASF-Wyandotte Corp.'s trademark for a series of block copolymers of polyexyethylene and polyoxypropylene. Pluronic F-127 has a polyoxypropylene base of about 70 oxypropylene units which are attached two polyethylene chains which contain in aggregate about 300 oxyethylene groups. In Pluronic F-68, the polyoxypropylene portion contains approximately 160 units. Pluronic L-42 has approximately 20 polyoxypropylene units and 15 polyoxyethylene units.

Polyox WSR 80 is a polyoxyethylene compound with an average molecular weight of 200,000 commercially available from Union Carbide Corp.

Olin 6G and 10G are alkylphenyl polyoxyethylene compounds with six and ten oxyethylene groups respectively. They are commercially available from Olin Corp. Stamford, Ct.

Tergitol Min Foam-1X is a polyoxy propylene-polyoxyethylene compound of a linear alcohol commercially available from Union Carbide Corp.

EXAMPLE XVI

The procedure in example XIV was repeated except that the electroplating solution was a nickel bath comprised as follows:

$NiSO_4 6H_2O$ 195 g/l
$NiCl_2 6H_2O$ 175 g/l
$H_3BO_3$ 40 g/l
pH 1.5
Temp. 46° C.

The nonionic surfactant added to this solution as Component C was Carbowax 1540 in a concentration of 0.1 g/l. After electroplating at a potential providing 3.8 A/dm² for 15 minutes, the hole walls were covered with a complete continuous film of nickel.

Example XVII

In order to more fully demonstrate the usefulness of polyoxyethylene groups in carrying out the invention, sodium lauryl sulfate, an anionic surfactant widely used in the electroplating industry, and recommended for use in acid copper sulfate electroplating baths was tested as follows. The procedure of Example XIV was repeated except that in one copper electroplating bath 1.0 g/l sodium lauryl sulfate (commercially available from E.I. Dupont de Nemours and Co. as Duponol C) was added as the surfactant instead of Pluronic F-127 and in a second and third electroplating bath solution 1.0 g/l ammonium polyether sulfate and 1.0 g/l ammonium lauryl polyether sulfate (commercially available as Sipon E A from Alcolac Inc. 3440 Fairfield Rd, Baltimore, MD) were used respectively instead of Pluronic F-127. After 5 minutes plating time both the polyether sulfate and polyether lauryl sulfate containing electroplating baths produced complete continuous films of copper covering the hole walls, while even after 15 minutes plating time electroplating in the lauryl sulfate containing electroplating did not cover the hole walls. This experiment shows that a simple linear anionic surfactant, lauryl sulfate, was ineffective for purposes of this invention. When the surfactant is selected according to the teachings of this invention such as when the lauryl sulfate structure was modified by the polyether group, it became effective as Component C.

EXAMPLE XVIII

The procedure of Example VIII was repeated except that substituted thioureas were substituted for Copper Gleam PC. In one copper electroplating solution, 5 mg/l tetramethylthiauram disulfide, and in a second such solution, 0.8 g/l of allyl thiourea were used respectively as Component C. After electroplating for 15 minutes at a potential providing 3.8 amp/sq.dm the hole walls of printed circuit boards plated in either solution were covered with a continuous film of copper.

It should be understood by those skilled in the art that various modifications may be made in the present invention without departing from the spirit and scope thereof as described in the specification and defined in the appended claims.

What is claimed is:

1. A method for metallizing a non-metallic surface, without prior electroless metal plating, by electroplating the non-metallic surface in a vessel provided with a counter-electrode and containing an electroplating bath solution comprising in ionic form a metal (B) to be electroplated, said non-metallic surface being provided with a conductive connector area, said connector area being located outside of and abutting the non-metallic surface area to be electroplated, said abutting connector area being employed as an electrode during electroplating, characterized by the steps comprising:
   (a) forming a plurality of discrete metallic sites on said non-metallic surface, each of said sites comprising metal (A), said metal (A) being different from said metal (B);
   (b) exposing said non-metallic surface including at least a portion of said connector area to the electroplating bath solution, said solution having a defined conductivity and further comprising at least one component (C) which allows deposition of said metal (B) on said metallic sites comprising or consisting of metal (A), at a rate which is faster compared to the deposition rate of said metal (B) on surfaces consisting of, or formed by, the species of the electrodeposited metal (B), with the proviso that component (C) does not comprise pyrophosphate anion;
   (c) applying a potential between the connector area and the counter-electrode which is sufficient to: (1) initiate electroplating of metal (B) on the exposed portion of the connector area and (2) allow electroplating of metal (B) on neighboring metallic sites, the application of said potential initiating electroplating of metal (B) on the connector area and on said neighboring metallic sites, the electroplating of metal (B) on the connector area covering the connector area with metal (B);
   (d) continuing the application of said potential until all of said neighboring metallic sites are covered with metal (B), the rate of forming metal (B) deposits on said neighboring metallic sites being greater than the electrodeposition rate of metal (B) on surfaces consisting of or formed by the species of metal (B), the greater rate of electrodeposition of metal (B) on said neighboring metallic sites continuing until all of said sites are covered with metal (B); and
   (e) continuously electroplating metal (B) on the exposed portion of said connector area and on said electroplated sites to produce an electrically conductive continuous film of metal (B) having a thickness of at least 0.5 microns.

2. The method of claim 1 characterized in that said component (C) preferentially attaches itself to a surface of the species of metal (B) compared to the surface of the species of metal (A), substantially inhibiting or reducing the plating reaction on surfaces formed by metal (B) without substantially interfering with the plating reaction on surfaces formed by the species of the site metal (A).

3. The method of claim 2, characterized in that said component (C) increases the overpotential on surfaces formed by metal (B).

4. The method of claim 1, characterized in that said component (C) preferentially attaches itself to the species of site metal (A), compared to the surface of the species of metal (B), said attached component (C) substantially increasing the plating reaction on surfaces formed by site metal (A) compared to the plating reaction on surfaces of the species of metal (B).

5. The method of claim 4 characterized in that said attached component (C) reduces the overpotential thus increasing the plating reaction compared to the plating reaction on surfaces of the species of metal (B).

6. The method of claim 1 characterized in that component (C) is selected from dyes, surfactants, chelating agents, brighteners and leveling agents.

7. The method of claim 6 characterized in that component (C) is a dye selected from methylene blue and methyl violet.

8. The method of claim 6 characterized in that component (C) is a surfactant selected from alkylphenoxy-polyethoxyethanols, nonionic fluorocarbon surfactants, polyoxyethylene compounds, block copolymers of polyoxyethylene and polyoxypropylene.

9. The method of claim 8 characterized in that component (C) is selected from compounds containing 4 to 1,000,000 oxyethylene groups.

10. The method of claim 9 characterized in the component (C) is selected from the compounds containing twenty to one hundred fifty oxyethylene groups.

11. The method of claim 8 characterized in that component (C) is selected from ethylene oxide-propylene oxide copolymers containing 10 to 400 oxyethylene groups.

12. The method of claim 6 characterized in that component (C) is 2,4,6-(2-pyridyl)-s-triazine.

13. The method of claim 6 characterized in that component (C) comprises a brightener and/or leveling agent selected from N-heterocyclic compounds, triphenyl methane dyes, thiourea, allyl thiourea, tetrathiuram disulfide, thiourea derivatives, saccharin and O-benzaldehyde sulfonic acid derivatives.

14. The method of claim 1 characterized in that the conductivity of the electroplating bath solution and the potential applied to the connector area and the counter-electrode are selected sufficiently high to achieve a rate of deposition on the surface of the species of the site metal (A) which is at least one order of magnitude higher than the deposition rate on the surface of the species of metal (B).

15. The method of claim 14 characterized in that the potential is adjusted to compensate for the potential drop on the resistive path formed by the plating bath solution between the connector area and the metallic sites consisting of, or comprising metal (A), and between such neighboring sites.

16. The method of claim 1 characterized in that metal (A) and metal (B) are selected from Groups Ib and VIII of the Periodic Table of Elements.

17. The method of claim 16 characterized in that component (C) is selected from dyes, surfactants, chelating agents, brighteners and leveling agents.

18. The method of claim 16 characterized in that metal (A) is selected from palladium, platinum, silver or gold.

19. The method of claim 16 characterized in that metal (B) is selected from copper and nickel.

20. The method of claim 1 characterized in that metals (A) and (B) are selected so that potential for the deposition of metal (B) on metal (A) is less negative than the potential for the deposition of metal (B) on itself under the conditions provided by the plating operation.

21. The method of claim 20 characterized in that component (C) is selected from dyes, surfactants, chelating agents, brighteners and leveling agents.

22. The method of claim 1 characterized in that the site formation step comprises employing metal (A) in solution as a compound or complex.

23. The method of claim 22 characterized in that the compound is a metal halide or double metal halide.

24. The method of claim 23 characterized in that the double metal halide is a palladium-tin-chloride.

25. The method of claim 23 characterized in that the plurality of metal sites of metal (A) is formed by treating the non-metallic surface with a solution comprising metal (A) and subsequently exposing said surface to heat or to a reducing agent.

26. The method of claim 25 characterized in that said heat-treatment is effected at a temperature in the range of 65° to 120° C. and for at least 10 minutes.

27. The method of claim 25 characterized in that said reducing agent is selected from sodium borohydride, formaldehyde, dimethylamine borane and hydroxylamine.

28. The method of claim 22 characterized in that the solution comprises metal (A) and a tin-halide; and that the treated surface is subsequently exposed to a solvent for tin-compounds.

29. The method of claim 1 characterized in that it further comprises the steps of terminating the deposition of metal (B) after establishing a continuous film of metal (B) of desired thickness over the non-metallic surface; and by electrolytically depositing one or more metal layers on said film or part thereof.

30. The method of claim 29 characterized in that at least two electroplating bath solutions of different composition are employed; and that the first used solution comprises components which maximize the rate of deposition on metal (A) and that the electroplating bath solutions employed subsequently are formulated for optimizing the properties of the respective metal deposit formed.

31. In a method for the manufacture of printed circuit board which includes forming holes in a copper clad insulating sheet, or in a laminate formed by a plurality of such sheets, and providing the non-metallic walls of said holes with a metal layer, without prior electroless metal plating, the improvement which comprises:
    (a) providing a vessel containing a counter-electrode and an electroplating bath of predetermined conductivity comprising in dissolved form a metal (B) to be electroplated, said copper cladding being located outside of and abutting the non-metallic surface of said walls to be electroplated, said abutting copper cladding being employed as an electrode during electroplating;
    (b) forming a plurality of discrete metallic sites on the walls of said holes, each of said sites comprising or consisting of a metal (A), said metal (A) being different from metal (B);
    (c) at a subsequent step exposing said sheet or laminate including said copper cladding thereon to the electroplating bath solution which further comprises at least one component (C) which allows preferential deposition of said metal (B) on said metallic sites comprising or consisting of metal (A), at a rate which is faster compared to the electrodeposition rate of metal (B) on surfaces consisting of or formed by the species of the electrodeposited metal (B), with the proviso that component (C) does not comprise pyrophosphate anion;
    (d) applying a potential between the copper cladding and the counter-electrode which is sufficient to: (1) initiate electroplating of metal (B) on the exposed portion of the copper cladding and (2) allow electroplating of metal (B) on neighboring metallic sites, the application of said potential initiating electroplating of metal (B) on the copper cladding and on said neighboring metallic sites, the electroplating of metal (B) on the copper cladding covering the copper cladding with metal (B);
    (e) continuing the application of said potential until all said neighboring metallic sites are covered with metal (B), the rate of forming metal (B) deposits on said neighboring metallic sites being greater than the electrodeposition rate of metal (B) on surfaces consisting of or formed by the species of metal (B), the greater rate of electrodeposition of metal (B) on said neighboring metallic sites continuing until all of said sites are covered with metal (B); and
    (f) continuously electroplating metal (B) on said sheet or laminate to produce an electrically conductive continuous film of metal (B) having a thickness of at least 0.5 microns.

32. The method of claim 31 characterized in that it further comprises the steps of providing a negative image resist layer on the surface of said copper clad sheet or laminate, said layer leaving exposed the areas corresponding to a desired conductor pattern which includes said holes, the walls defining said holes provided with said sites of metal (A); and, after establishing a continuous film of metal (B) electrolytically depositing one or more metal layers on said film, removing said resist layer and etching away the metal in the areas which have been covered by said resist layer.

33. The method of claim 31 characterized in that it further comprises the steps of electrolytically depositing one or more layers of metal over the metal (B) film;

providing a positive image resist layer on the surface of said copper clad sheet or laminate subsequent to the electroplating step, said resist layer covering the areas corresponding to the desired circuit pattern including the holes; and etching away the metal not covered by the positive image resist layer thus forming the printed circuit board pattern.

34. In a method for the manufacture of printed circuit boards comprising forming holes in a non-metallic sheet and metallizing, without prior electroless metal plating, non-metallic areas of said sheet corresponding to a desired printed circuit conductor pattern with a metal layer having a desired thickness, the improvement which comprises:
   (a) providing a vessel containing a counter-electrode and containing an electroplating bath solution of defined conductivity comprising in ionic form a metal (B) to be electroplated, said non-metallic areas being provided with a conductive connector area, said connector area being located outside of and abutting the non-metallic surface area to be electroplated said abutting connector area being employed as an electrode during electroplating;
   (b) forming a plurality of discrete metallic sites on the walls of said holes, each of said sites comprising or consisting of a metal (A), said metal (A) being different from a metal (B) to be electroplated;
   (c) at a subsequent step exposing said sheet including said connector area to the electroplating bath solution which further comprises one or more component(s) (C) which allow deposition of said metal (B) on said metallic sites comprising or consisting of metal (A), at a rate which is faster compared to the electrodeposition rate of metal (B) on surfaces formed by the species of the electro-deposited metal (B), with the proviso that component (C) does not comprise pyrophosphate anion;
   (d) applying a potential between the connector area and the counter-electrode which is sufficient to: (1) initiate electroplating of metal (B) on the exposed portion of the connector area and (2) allow electroplating of metal (B) on neighboring metallic sites, the application of said potential initiating electroplating of metal (B) on the connector area and on said neighboring metallic sites, the electroplating of metal (B) on the connector area covering the connector area with metal (B);
   (e) continuing the application of said potential until all said neighboring metallic sites are covered with metal (B), the rate of forming metal (B) deposits on said neighboring metallic sites being greater than the electrodeposition rate of metal (B) on surfaces consisting of or formed by the species of metal (B), the greater rate of electrodeposition of metal (B) on said neighboring metallic sites continuing until all of said sites are covered with metal (B); and
   (f) continuously electroplating metal (B) onto the exposed portion of the connector area and onto said electroplated sites to produce an electrically conductive continuous film of metal (B) having a thickness of at least 0.5 microns.

35. The method of claim 34 characterized in that said connector area covers the surface of said insulating sheet in small areas along its edges, and shaped like a window frame.

36. In a method for the manufacture of printed circuit boards which include forming holes in a copper clad insulating sheet, or in a laminate formed from a plurality of such sheets, and providing the walls of said holes with metal layers, the improvement which comprises:
   (a) forming a plurality of metal sites on the walls of said holes, the metal of said sites being selected from the group consisting of palladium, platinum, silver and gold; and
   (b) at a subsequent step, without prior electroless metal plating, electrodepositing copper on the hole walls from an acidic electroplating bath comprising copper ions, and an organic compound containing 4 to 1,000,000 oxyethylene groups, the electrodeposited copper on the hole walls forming a continuous conductive film; and
   (c) further electroplating copper to reinforce the continuous conductive film and form plated through holes in the insulating sheet.

37. The method of claim 36 wherein the acidic electroplating bath also comprises sulfuric acid.

* * * * *